(12) United States Patent
Fajardo et al.

(10) Patent No.: US 9,245,837 B1
(45) Date of Patent: Jan. 26, 2016

(54) RADIO FREQUENCY POWER DEVICE

(71) Applicant: Infineon Technologies AG, Neubiberg (DE)

(72) Inventors: Eljurey Azcarraga Fajardo, Melaka (MY); Siti Maznah Abdul Rahim, Melaka (MY); Victor dela cruz Del Rosario, Melaka (MY); Xavier Arokiasamy, Melaka (MY); Vittal Raja Manikam, Selangor (MY)

(73) Assignee: Infineon Technologies AG, Neubiberg (DE)

( * ) Notice: Subject to any disclaimer, the term of this patent is extended or adjusted under 35 U.S.C. 154(b) by 8 days.

(21) Appl. No.: 14/324,349

(22) Filed: Jul. 7, 2014

(51) Int. Cl.
| H01L 25/00 | (2006.01) |
| H01L 23/498 | (2006.01) |
| B23K 31/02 | (2006.01) |
| H01L 23/00 | (2006.01) |
| H01L 21/56 | (2006.01) |
| H01L 23/31 | (2006.01) |

(52) U.S. Cl.
CPC .......... *H01L 23/49838* (2013.01); *B23K 31/02* (2013.01); *H01L 21/56* (2013.01); *H01L 23/3107* (2013.01); *H01L 24/49* (2013.01); *H01L 24/85* (2013.01); *H01L 2224/48137* (2013.01); *H01L 2924/1033* (2013.01); *H01L 2924/10253* (2013.01); *H01L 2924/10272* (2013.01); *H01L 2924/10329* (2013.01); *H01L 2924/1205* (2013.01); *H01L 2924/1305* (2013.01); *H01L 2924/13091* (2013.01); *H01L 2924/3011* (2013.01)

(58) Field of Classification Search
CPC ......... H01L 24/34; H01L 24/39; H01L 24/40; H01L 24/41
See application file for complete search history.

(56) References Cited

U.S. PATENT DOCUMENTS

| 7,256,434 B2 * | 8/2007 | Ohbu | H01L 27/0605 257/164 |
| 7,605,451 B2 * | 10/2009 | Moline | H01L 23/4334 257/666 |
| 9,083,282 B2 * | 7/2015 | Zhang | H04B 1/0458 1/1 |

* cited by examiner

*Primary Examiner* — Jeffrey Zweizig
(74) *Attorney, Agent, or Firm* — Murphy, Bilak & Homiller, PLLC

(57) ABSTRACT

An electronic RF power device includes a transistor chip, a device input terminal and a device output terminal. Further, the electronic RF power device includes an output impedance transformation circuit, an output contact clip bonded to the transistor chip and to the output device terminal and at least one bond wire bonded to the output impedance transformation circuit and to the transistor chip.

20 Claims, 6 Drawing Sheets

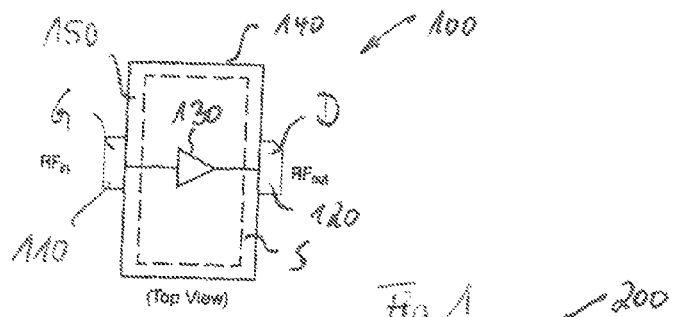

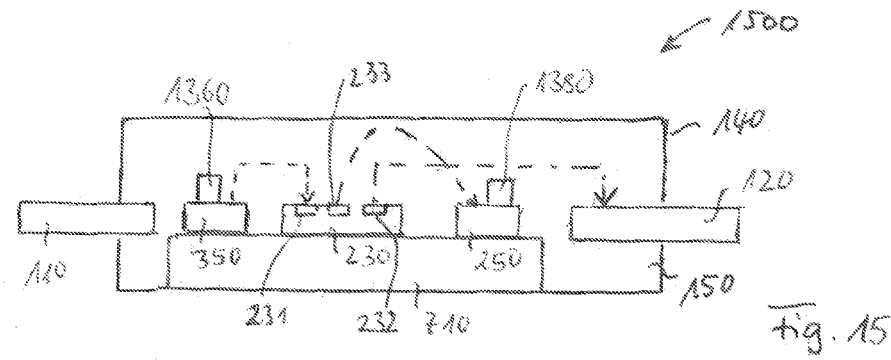
Fig. 15
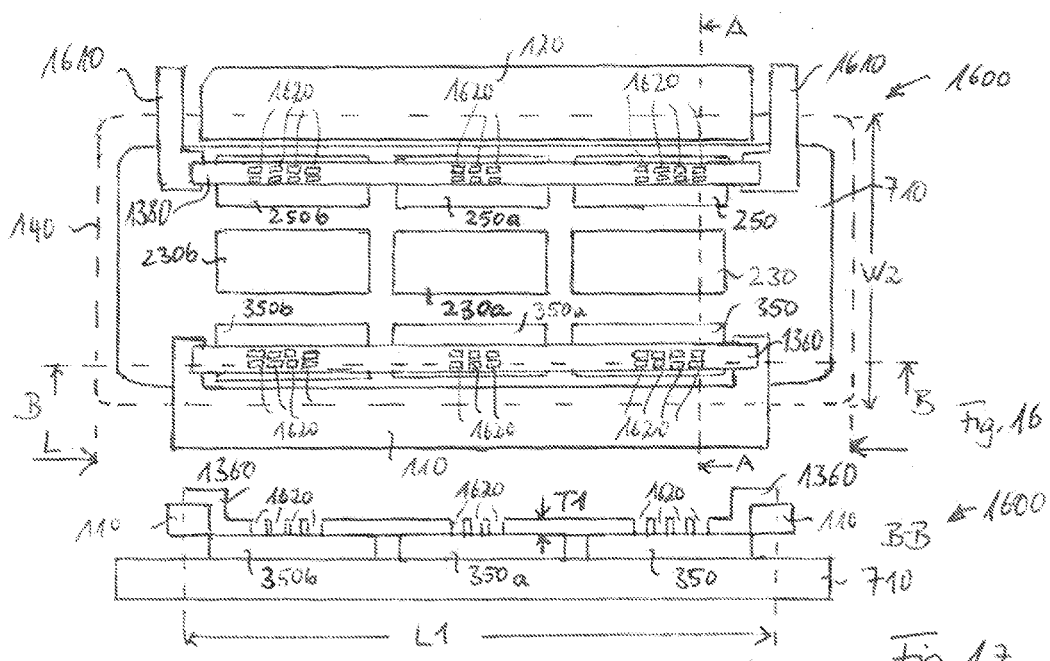
Fig. 16
Fig. 17
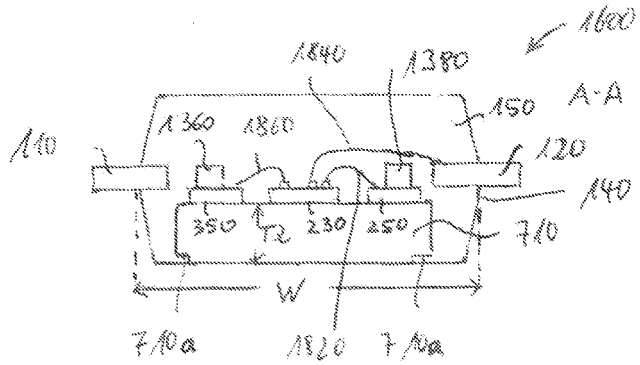
Fig. 18

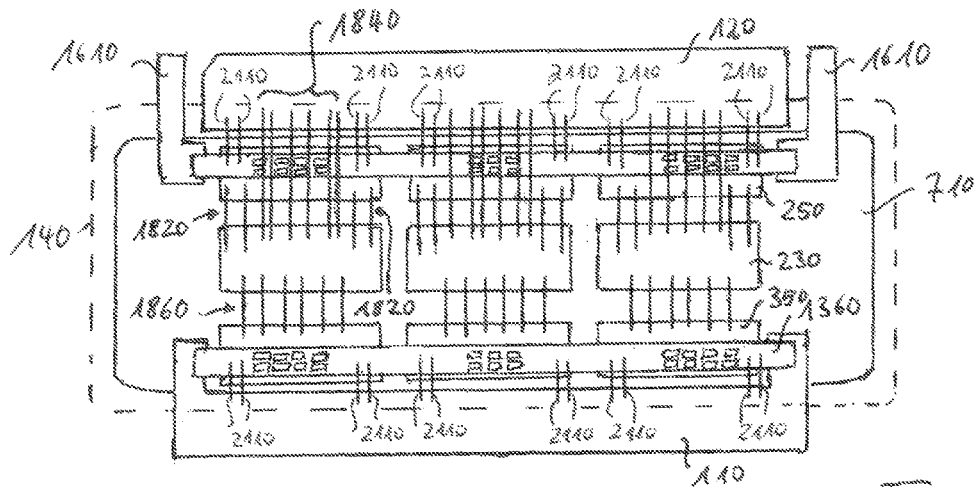

Fig. 21

| Mounting a transistor chip on a carrier | S1 |

| Mounting at least one of an input impedance transformation circuit and an output impedance transformation circuit on the carrier | S2 |

| Bonding at least one of a first contact clip to the input impedance transformation circuit and to a device input terminal and a second contact clip to an output impedance transformation circuit and to a device power supply terminal, wherein the at least one of the first contact clip and the second contact clip comprises a mesh structure formed by a pattern of openings | S3 |

Fig. 22

RADIO FREQUENCY POWER DEVICE

TECHNICAL FIELD

This invention relates to the technique of packaging, and in particular to the technique of packaging a radio frequency power device.

BACKGROUND

Radio frequency (RF) power device manufacturers are constantly striving to increase the performance of their products, while decreasing their cost of manufacture. A cost intensive area in the manufacture of RF power devices is packaging the device. Performance, reliability and manufacturing tolerances of RF power devices are, inter alia, dependent from the bonding technology and heat dissipation capability provided by the package. Packaging methods providing highly reliable devices with small manufacturing tolerances and high thermal robustness at low expenses are desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a schematic top view diagram of an exemplary RF power electronic device.

FIG. 2 schematically illustrates a cross-sectional view of an exemplary electronic RF power device.

FIG. 3 schematically illustrates a cross-sectional view of an exemplary electronic RF power device.

FIG. 4 schematically illustrates a cross-sectional view of an exemplary electronic RF power device.

FIG. 15 schematically illustrates a cross-sectional view of an exemplary electronic RF power device.

FIG. 16 schematically illustrates a top view of an exemplary electronic RF power device.

FIG. 17 schematically illustrates a cross-sectional view of an exemplary electronic RF power device along line B-B of FIG. 16.

FIG. 18 schematically illustrates a cross-sectional view of an exemplary electronic RF power device along line A-A of FIG. 16.

FIG. 21 schematically illustrates a top view of the exemplary electronic RF power device of FIGS. 16 to 18 equipped with an exemplary internal wiring.

FIG. 22 is a flowchart illustrating an exemplary method of manufacturing an electronic RF power device.

DETAILED DESCRIPTION OF ILLUSTRATIVE EMBODIMENTS

Figure 5:
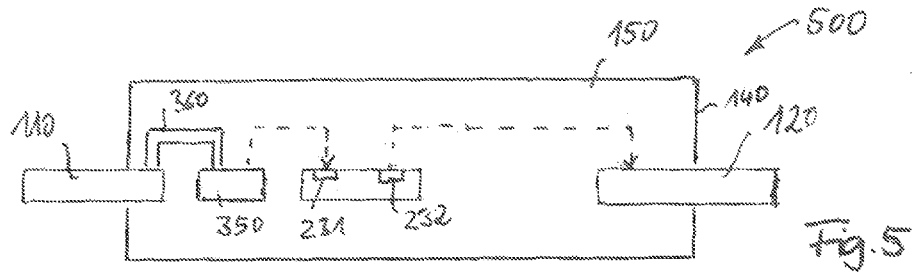
FIG. 5 schematically illustrates a cross-sectional view of an exemplary electronic RF power device.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

It is to be understood that the features of the various exemplary embodiments described herein may be combined with each other, unless specifically noted otherwise.

Devices containing a transistor chip are described herein. In particular, one or more transistor chips having a vertical structure may be involved, that is to say that the transistor chips may be fabricated in such a way that electric currents can flow in a direction perpendicular to the main surfaces of the transistor chips. A transistor chip having a vertical structure has load electrodes on its two main surfaces, that is to say on its top side and bottom side. In various other embodiments, transistor chips having a horizontal structure may be involved. A transistor chip having a horizontal structure has the control electrode and the load electrodes on one surface, that is to say on its top side.

The transistor chip may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors. Transistor chips considered herein may be of different types and may be manufactured by different technologies. Transistor chips considered herein may be power transistor chips.

The transistor chip may have electrodes (chip pads) which allow electrical contact to be made with further components (e.g. impedance transformation circuit(s)) and/or external device terminals (e.g. device input terminal, device output terminal, device power terminal) The electrodes may include one or more metal layers which are applied to the transistor chip and are electrically connected with the active region of the transistor chip. The metal layers may be manufactured with any desired geometric shape and any desired material composition. The metal layers may, for example, be in the form of a layer or land covering an area. By way of example, any desired metal, for example Cu, Ni, NiSn, Au, Ag, Pt, Pd, In, Sn, and an alloy of one or more of these metals may be used as the electrode layer material.

Transistor chips considered herein may, for example, be configured as LDMOS (Laterally Diffused Metal Oxide Semiconductor), MOSFETs (Metal Insulator Semiconductor Field Effect Transistors), MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), or bipolar transistors.

The electronic RF power devices described herein may comprise an output impedance transformation circuit. Output impedance transformation may be provided to transform the impedance level for obtaining a greater operational bandwidth and to reduce RF losses. Output impedance transformation may also be referred to as output impedance matching. By way of example, the output impedance transformation circuit may be implemented by a compensation inductance called INSHIN (INternal SHunt INductance). The output impedance transformation circuit may be connected between the device output terminal and ground. That is by way of example, one or more decoupling capacitors may be provided within the package and may be connected between the device output terminal and ground.

Further, the electronic RF power devices described herein may comprise an input impedance transformation circuit. The input impedance transformation circuit may serve to transform the input impedance level of the electronic RF power device. The input impedance transformation circuit may be implemented by one or more pre-match capacitors connected to the device input terminal and provided within the package.

According to one aspect, an electronic RF power device considered herein may comprise an output contact clip bonded to the transistor chip and to the output device terminal. By using such contact clip instead of bond wires, wire sweep on a load electrode of the transistor chip (e.g. the drain electrode) during molding may be eliminated. Further, an output contact clip offers the possibility of using cheaper clip material (e.g. copper) compared to conventional gold wires as used in the art. Additional advantages by using an output contact clip instead of bond wires are that the process cycle time may be reduced, the manufacturing process may be simplified and a more effective heat dissipation may be obtained.

Further, the electronic RF power device may, e.g., comprise a first input contact clip bonded to the device input terminal and to the input impedance transformation circuit and may, e.g., further comprise a second input contact clip bonded to the input impedance transformation circuit and to an electrode (e.g. gate electrode) of the transistor chip. By using such first and/or a second input contact clip, the various advantages described above for the output side of the device may also be obtained for the input side of the device.

According to another aspect, an electronic RF power device may comprise at least one of a first contact clip bonded to the input impedance transformation circuit and to the device input terminal and a second contact clip bonded to the output impedance transformation circuit and to the device power supply terminal, wherein the at least one of the first contact clip and the second contact clip comprises a mesh structure formed by a pattern of openings. By designing a first and/or a second contact clip to comprise a mesh structure having a pattern of openings, the same advantages, as described above (e.g. elimination of wire sweep during molding, cheap contact clip material, reduced manufacturing process cycle time, etc.), may be obtained. Further, the mesh structure may act as a mold lock mechanism to more securely fix a molding material (encapsulant) used during packaging to the internal structure (transistor chip, the device terminals and the internal wiring there between) of the electronic RF power device. Additional advantages could comprise an improvement of the electrical signal speed, a reduction of manufacturing tolerances, easier RF tuning processes, and the offering of more space on the carrier allowing to improve the die-to-die spacing.

The transistor chip(s) considered herein may be mounted over an electrically conducting carrier. In various embodiments, the electrically conducting carrier may be a metal plate or sheet such as, e.g., a die pad of a leadframe. In other embodiments, the electrically conducting chip carrier may comprise ceramics coated with a metal layer, e.g. a metal bonded ceramics substrate. Byway of example, the electrically conducting carrier may, e.g., be a DCB (Direct Copper Bonded) ceramics substrate.

The electrically conducting carrier may be mechanically, thermally and, e.g., electrically connected to the transistor chip. The electrically conducting carrier may be or comprise of any metal or metal alloy, in particular of metals having a high thermal conductivity and/or a high thermal capacity such as, e.g., copper or copper alloy. The electrically conducting carrier may serve as a device-internal heat sink. It may allow both for effective static heat dissipation and effective dynamic heat dissipation of thermal power losses of the transistor chip(s) mounted thereon.

The transistor chip(s) may at least partly be surrounded or embedded in at least one electrically insulating material. The electrically insulating material forms an encapsulation body (encapsulant) of the package. The encapsulant may comprise or be made of a mold material. Various techniques may be employed to form the encapsulant of the mold material, for example compression molding, injection molding, powder molding, or liquid molding. The encapsulant may form part of the periphery of the package, i.e. may at least partly (e.g. at the side and top faces) define the shape of the electronic RF power device.

The electrically insulating material forming the encapsulant may comprise or be a thermoset material or a thermoplastic material. A thermoset material may, e.g., be made on the basis of an epoxy resin. A thermoplastic material may, e.g., comprise one or more materials of the group of polyetherimide (PEI), polyether-sulfone (PES) polyphenylene-sulfide (PPS) or polyamide-imide (PAI). Thermoplastic materials melt by application of pressure and heat during molding and (reversibly) harden upon cooling and pressure release.

The electrically insulating material forming the encapsulant may comprise or be a polymer material. The electrically insulating material may, e.g., comprise at least one of a filled or unfilled mold material, a filled or unfilled thermoplastic material, or a filled or unfilled thermoset material.

A variety of different types of electronic RF power devices may be configured to use contact clips as described herein and/or may be manufactured by the techniques described herein. By way of example, an electronic RF power device in accordance with the instant disclosure may constitute, e.g., a transistor outline power package used for various RF applications, e.g., microwave devices, cellular base station devices, broadcast devices, radar devices such as, e.g., S-band radar, etc.

Electronic RF power devices as described herein may operate in a frequency range from, e.g., about 0.1 GHz to 10 GHz or more. By way of example, applications in the frequency range above 0.5 GHz (e.g. in the frequency range from 725-770 MHz) or in a frequency range above 1.0 GHz or 2.0 GHz (e.g. in the 2.11 to 2.17 GHz frequency band) or in a range above 3.0 GHz (e.g. in the 3.0 to 4.0 GHz range for microwave applications or radar applications) are possible. By way of example, base station applications may cover, e.g., GSM-EDGE applications at 1.0 to 2.0 GHz (e.g. the frequency band 1.805 to 1.880 GHz), WCDMA (Wideband Code Division Multiple Access) applications at, e.g., 2.0 to 3.0 GHz, and WiMax (Worldwide Interoperability for Microwave Access) at, e.g., 2.0 to 4.0 GHz, e.g. around 2.7 GHz and 3.8 GHz.

Electronic RF power devices described herein may have, in operation, an output power equal to or greater than, e.g., 1 W, 10 W, 50 W, 100 W, 300 W, 500 W, or 1 kW.

Referring to FIG. 1, an exemplary electronic RF power device 100 in accordance with one embodiment may comprise a RF device input terminal 110 and a RF device output terminal 120. As will be described in more detail further below, the device input terminal 110 may be coupled to a gate electrode (G) of a transistor chip contained in the electronic RF power device 100 and the device output terminal 120 may be coupled to a load electrode, e.g., drain electrode (D) of the transistor chip. Another load electrode of the transistor chip, e.g. a source electrode (S), may be available at the bottom of the electronic RF power device 100.

More specifically, reference numeral 130 denotes an amplification stage of the electronic RF power device 100 which may be implemented by one or more transistor chips. Reference numeral 140 denotes the outline of an encapsulant (e.g. molding material body) 150 encapsulating the amplification stage 130 and forming, e.g., the periphery of the package. It is to be noted that the load electrode of the transistor chip which is not coupled to the device output terminal 120 may be coupled to a carrier (chip pad) which may form a bottom external terminal (e.g. source electrode terminal) of the electronic RF power device 100.

FIG. 2 illustrates a cross-sectional view of an exemplary electronic RF power device 200. The electronic RF power device 200 may be identical to electronic RF power device 100, and reiteration of features described in conjunction with FIG. 1 is avoided for the sake of brevity.

A transistor chip 230 comprises a control electrode 231 which may be interconnected to the device input terminal 110. The interconnection is illustrated by a dotted line indicating that a variety of different direct interconnections may be provided, e.g., bond wire(s), a contact clip, or indirect interconnections via an input impedance transformation circuitry as will be described in more detail below. The transistor chip 230 may comprise a first load electrode 232. The first load electrode 232, which may be, e.g., the drain electrode of the transistor chip 230, may be coupled via an output contact clip 240 to the device output terminal 120. The output contact clip 240 may be a direct connection between the first load electrode 232 and the output terminal 120, i.e. one end of the output contact clip 240 may be bonded directly to the first load electrode 232 and the other end of the output contact clip 240 may be bonded directly to the device output terminal 120. The output contact clip 240 may comprise or be of a metal or metal alloy, e.g. of copper, thus eliminating the need to use gold bond wires as an internal interconnect.

The electronic RF power device 200 may further comprise an output impedance transformation circuit 250. The output impedance transformation circuit 250 may be implemented as one or more capacitor dies. The output impedance transformation circuit 250 may be connected to a second load electrode 233 of the transistor chip 230. The connection between the output impedance transformation circuit 250 and the second load electrode 233 of the transistor chip 230 may be implemented by one or more bond wires (e.g. so-called "tuning wire(s)").

The transistor chip 230 and the output impedance transformation circuit 250 may, e.g., be mounted on a common carrier (not shown in FIG. 2). This common carrier may serve both to provide electrical contact to the transistor chip 230 and the output impedance transformation circuit 250 and to form a heat sink for effective power dissipation. The common carrier (not shown) may be exposed at the bottom of the package formed by the encapsulant 150 to provide for a bottom external terminal (e.g. source terminal) of the electronic RF power device 200.

FIG. 3 illustrates a sectional view of an exemplary electronic RF power device 300. The electronic RF power device 300 may comprise similar parts as the electronic RF power device 200, and reference is made to the above description in order to avoid reiteration. In addition, electronic RF power device 300 may comprise an input impedance transformation circuit 350. Similar to the output impedance transformation circuit 250, the input impedance transformation circuit 350 may be implemented by one or more capacitor dies. The input impedance transformation circuit 350 may, e.g., be mounted on the common carrier (not shown in FIG. 3) on which the transistor chip 230 and, e.g., the output impedance transformation circuit 250 are mounted.

The input impedance transformation circuit 350 may be connected to the device input terminal 110 by a first input contact clip 360. The first input contact clip 360 may directly interconnect the device input terminal 110 to the input impedance transformation circuit 350, i.e. one end of the first input contact clip 360 may be bonded to the device input terminal 110 and the other end of the first input contact clip 360 may be bonded to the input impedance transformation circuit (e.g. to an electrode of a capacitor die thereof). Further, the input impedance transformation circuit 350 may be electrically connected to the control electrode 231 of the transistor chip 230. This connection is indicated by a dashed line and may be implemented by a variety of possibilities including bond wire(s), contact clip(s), etc.

The input impedance transformation circuit 350 may comprise one or more capacitors (so-called "pre-match capacitors"). It is to be noted that the same electrode of the input impedance transformation circuit or of the capacitor(s) included therein may be bonded both to the first input contact clip 360 and to the control electrode 231 of the transistor chip 230.

FIG. 4 illustrates an exemplary electronic RF power device 400. Electronic RF power device 400 may be similar to electronic RF power device 300 except that the interconnection between the input impedance transformation circuit 350 and the control electrode 231 of the transistor chip 230 is formed by a second input contact clip 460. By way of example, one end of the second input contact clip 460 is bonded to an electrode of the input impedance transformation circuit 350 and the other end of the second input contact clip 460 is bonded to the control electrode 230 of the transistor chip 230. That is, electronic RF power device 400 may comprise at least three contact clips, i.e. a first input contact clip 360, a second input contact clip 460, and an output contact clip 240.

FIG. 5 illustrates, by way of example, an exemplary electronic RF power device 500. In view of the parts described in conjunction with FIGS. 1-4, the electronic RF power device 500 may be similar to the electronic RF power devices 100-400. However, the electronic RF power device 500 may be configured to have a direct electrical interconnection (indicated by a dashed line) between the first load electrode 232 and the device output terminal 120, whereby the direct electrical interconnection may be implemented by a variety of different parts including, e.g., one or more bond wires or one or more output contact clips. Further, as illustrated in FIG. 5, the electrical interconnection between the device input terminal 110 and the input impedance transformation circuit 350 is provided by the first input contact clip 360 as described above.

Figure 6:
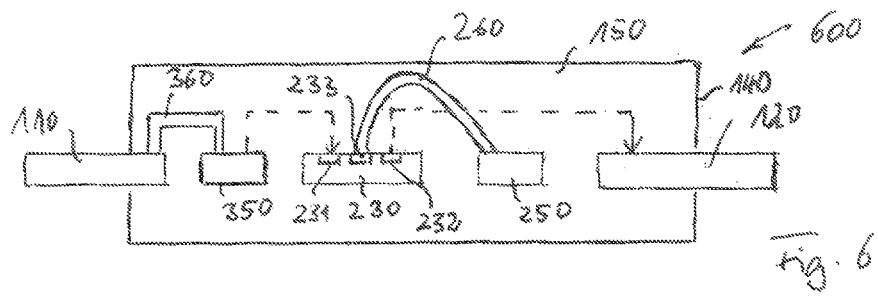
FIG. 6 schematically illustrates a cross-sectional view of an exemplary electronic RF power device.

FIG. 6 illustrates an exemplary electronic RF power device 600. The exemplary electronic RF power device 600 may be designed similar to the electronic RF power device 500 except that the electronic RF power device 600 comprises the output impedance transformation circuit 250 and the bond wire ("tuning wire") 260 configured to connect the second load electrode 233 of the transistor chip 230 to an electrode of the output impedance transformation circuit 250, e.g. formed by one or more INSHIN capacitors.

Figure 7:
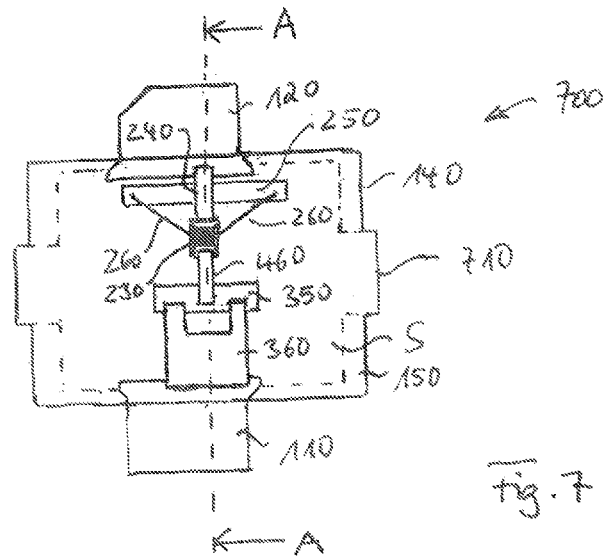
FIG. 7 schematically illustrates a top view of an exemplary electronic RF power device.

FIG. 7 illustrates a top view of an exemplary electronic RF power device 700. The top view may correspond to the sectional views of electronic RF power devices 100-600 shown in FIGS. 1-6, wherein, byway of example, a specific arrangement of using, e.g., three contact clips (e.g. the first input contact clip 360, the second input contact clip 460, and the output contact clip 240) is illustrated. Further, FIG. 7 illustrates a common carrier 710 on which the transistor chip 230, e.g., the output impedance transformation circuit 250, and, e.g., the input impedance transformation circuit 350, are mounted. The carrier 710 may serve as a heat sink and, e.g., as another external terminal (in addition to device input terminal 110 and device output terminal 120) of the electronic RF power device 700. As mentioned before, such carrier 710 may optionally be included in all electronic RF power devices 100-600.

Figure 8:
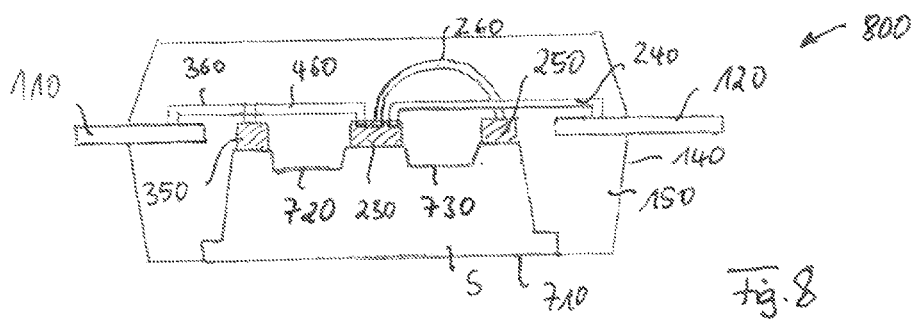
FIG. 8 schematically illustrates a cross-sectional view of an exemplary electronic RF power device along line A-A of FIG. 7.

FIG. 8 illustrates an exemplary electronic RF power device 800. The illustration of FIG. 8 may, e.g., be a sectional view along line A-A of FIG. 7, that is the electronic RF power devices 700 and 800 may, e.g., be the same. As is apparent in FIG. 8, the carrier 710 may comprise trenches 720, 730 located between the input impedance transformation circuit 350 and the transistor chip 230 and between the transistor chip 230 and the output impedance transformation circuit 250, respectively. The trenches 720, 730 are recesses formed in the upper surface of the carrier 710 on which the electronic components 230, 250, 350 are mounted. The trenches 720, 730 may enhance the electrical insulation between the transistor chip 230 and the output and input impedance transformation circuits 250, 260, respectively. Thus, the trenches 720, 730 may help to eliminate chip-to-chip shorting. As previously mentioned, the input and output impedance transformation circuits 250, 350 may be implemented by capacitors dies (chips) with one electrode of each capacitor die connected to the carrier 710 and the other electrode of the capacitor die connected to the contact clips 360, 460 and the bond wire ("tuning wire") 260, respectively.

Figures 9, 10:
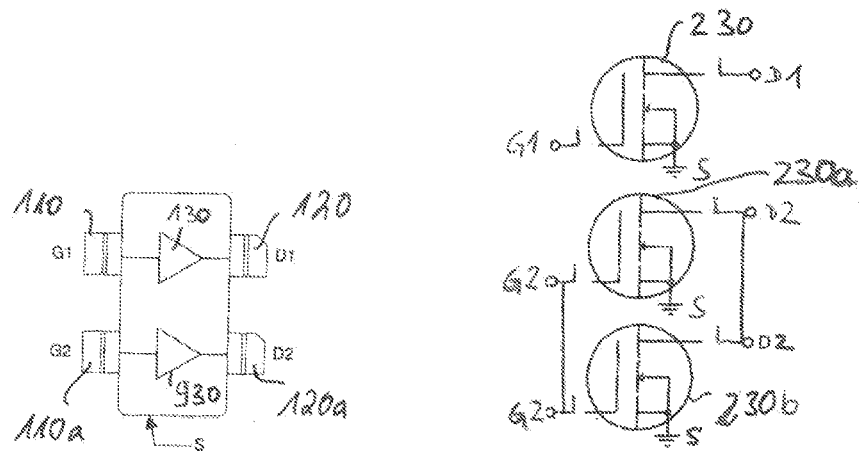
FIG. 9 illustrates a schematic top view diagram of an exemplary RF power electronic device.
FIG. 10 illustrates a schematic circuit diagram of the electronic RF power device of FIG. 9.
Figure 11:
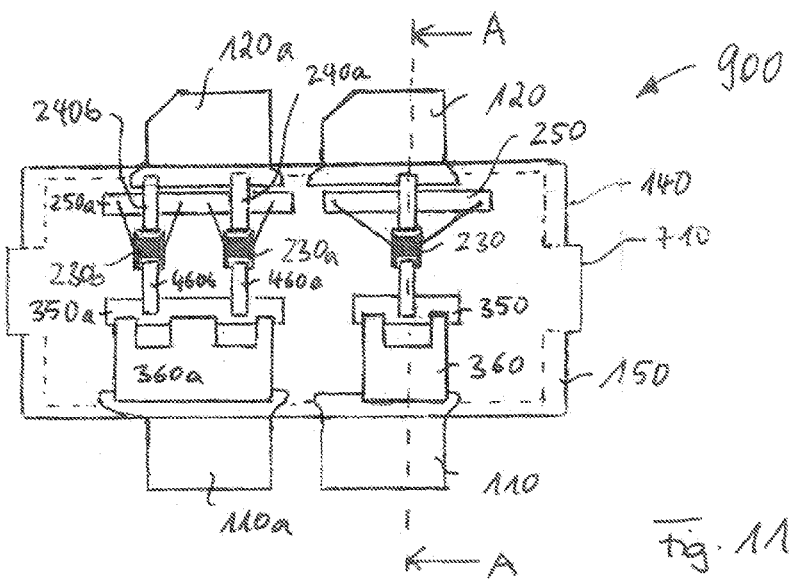
FIG. 11 schematically illustrates a top view of an exemplary electronic RF power device in accordance with, e.g., FIGS. 9 and 10.

FIGS. 9-11 illustrate an exemplary electronic RF power device 900. The electronic RF power device 900 may be similar to the electronic RF power devices 100-800 illustrated in FIGS. 1-8 except that two or more transistor chips 230, 230a and 230b are included. By way of example, the electronic RF power device 900 may comprise the first amplification stage 130 and a second amplification stage 930. While the first amplification stage 130 may comprise or be implemented by the transistor chip 230 (e.g. LDMOS of pin-out diagram of FIG. 10), the second amplification stage 930 may comprise or be implemented of the two transistor chips 230a, 230b as shown in FIG. 11 (e.g. LDMOS of FIG. 10). As shown in FIG. 11, e.g. in addition to contact clips 240, 360, 460, contact clips 240a, 240b; 360a; and 460a, 460b may be provided for interconnecting an additional device input terminal 110a and an additional device output terminal 120a to the transistor chips 230a, 230b in the same way as described above byway of a plurality of examples. It is to be noted that one first input contact clip 360a may be configured to connect to a plurality of transistor chips 230a, 230b that, on the other hand, may be interconnected to the input impedance transformation circuit 350a and/or to the device output terminal 120a by individual contact clips 460a, 460b and 240a, 240b, respectively. Further, it is to be noted that the external terminals 110, 110a and 120, 120a may, e.g., each be implemented by one single lead or pin or may be electrically interconnected within the electronic RF power device 900 to form, e.g., one device input terminal lead and one device output terminal lead. The transistor chips 230, 230a, 230b may have a bottom source metallization bonded to the carrier 710 (which may serve as the source terminal of the RF power device 900). The bottom source metallization may be provided in addition to source electrodes 233 on the top side of the transistor chips 230, 230a, 230b.

Figure 12:
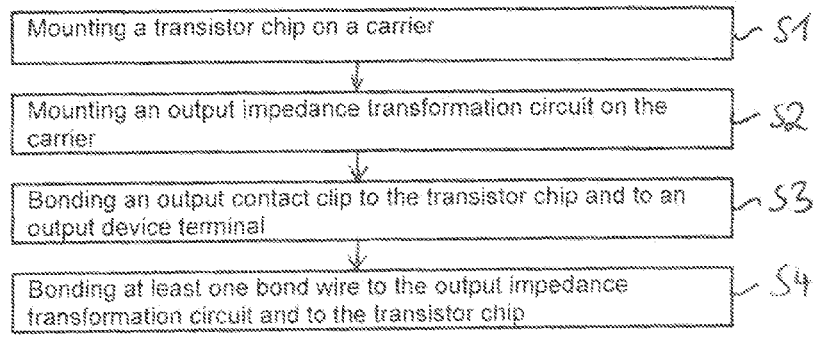
FIG. 12 is a flowchart illustrating an exemplary method of manufacturing an electronic RF power device.

FIG. 12 illustrates a flowchart of an exemplary process to manufacture an electronic RF power device as described herein. The process may, e.g., be applied to all exemplary electronic RF power devices 100-900 described herein.

At S1 a transistor chip is mounted on a carrier. By way of example, the carrier may be a leadframe which has been prepared, e.g. pre-plated, in advance of S1.

At S2 an output impedance transformation circuit may be mounted on the carrier. S2 may simply comprise a capacitor die attach to the carrier. S2 may be performed before, simultaneously or after S1. S2 may, e.g., also comprise the process of mounting the input impedance transformation circuit on the carrier.

At S3 an output contact clip is bonded to the transistor chip and to an output device terminal. S3 may further comprise the processes of bonding first and second input contact clips to the corresponding components in accordance with the above examples.

At S4, e.g., at least one bond wire is bonded to the output impedance transformation circuit and to the transistor chip. Thus, S3 and S4 embody a concept of using a "mixed interconnect" realized by contact clip (s) and bond wire (s). The bond wire (s) may be used to set the (tuning) frequency of the electronic RF power device.

After S4 additional steps such as, e.g., encapsulating/molding and, e.g., post mold curing, deflashing, trim/form/singulation of individual packages and placing the individual packages on a tray may be performed.

FIGS. 13-22 illustrate further examples for applying contact clip(s) to electronic RF power devices. The concepts and contact clips as described in conjunction with FIGS. 13-22, may be combined with the embodiments of electronic RF power devices as described in conjunction with FIGS. 1-12.

Figure 13:
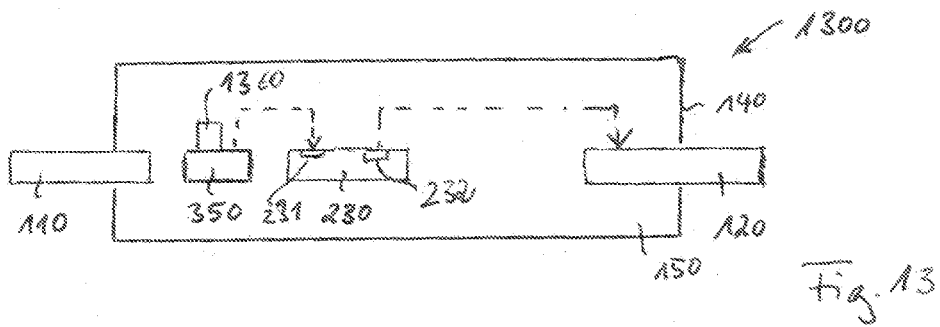
FIG. 13 schematically illustrates a cross-sectional view of an exemplary electronic RF power device.

Referring to FIG. 13, an exemplary electronic RF power device 1300 is illustrated. The electronic RF power device 1300 may comprise the transistor chip 230, the device input terminal 110, the device output terminal 120 and the input impedance transformation circuit 350. The electronic RF power device 1300 may further comprise a first contact clip 1360 bonded to the input impedance transformation circuit 350 and to the device input terminal 110 (as will be better understood from FIG. 18 as the sectional view of FIG. 13 may be along line A-A of FIG. 18 and therefore the connection between the first contact clip 1360 and the device input terminal 110 is not shown in FIG. 13). The first contact clip 1360 comprises a mesh structure formed by a pattern of openings, see FIGS. 18 and 19. The first contact clip 1360 may be identical or similar to the first input contact clip 360, as illustrated above, or may be designed different than the first input contact clip 360 as will be explained in more detail further below. Apart from this, the electronic RF power device 1300 may be similar to the electronic RF power devices 100-900 as described above and reference is made to the above disclosure in order to avoid reiteration.

Figure 14:
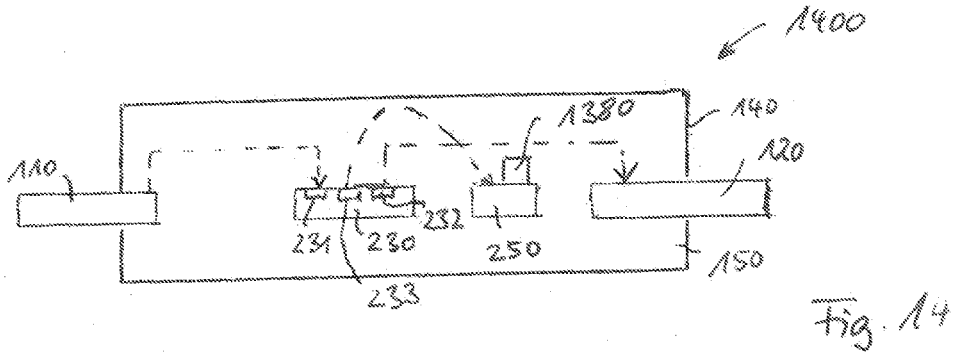
FIG. 14 schematically illustrates a cross-sectional view of an exemplary electronic RF power device.

Referring to FIG. 14, an exemplary electronic RF power device 1400 may comprise a device input terminal 110, a device output terminal 120 and the transistor chip 230. Further, the electronic RF power device 1400 may comprise the output impedance transformation circuit 250. A second contact clip 1380 may be bonded to the output impedance transformation circuit 250 and to a device power supply terminal (not shown in FIG. 14). FIG. 14 may be a sectional view along line A-A of FIG. 18 and therefore, the connection between the second contact clip 1380 and the device power supply terminal is not visible in FIG. 14. The second contact clip 1380 may comprise a mesh structure formed by a pattern of openings (see FIG. 18).

FIG. 15 illustrates an exemplary electronic RF power device 1500 which comprises both the first contact clip 1360 and the second contact clip 1380 as exemplified in FIGS. 13 and 14, respectively. A common carrier 710 as described above may be used.

Again, in FIGS. 13, 14 and 15, dashed lines illustrate device-internal electrical interconnections (i.e. internal device "wiring") between the corresponding components connected by the dashed lines, which may be implemented in various different ways (e.g. by bond wires, contact clips, etc.).

Reference is made to the exemplary electronic RF power devices 100-900 for possible examples to implement these interconnections.

Referring to FIG. 16, a top view of an exemplary electronic RF power device 1600 is shown. The electronic RF power device 1600 may, e.g., comprise a plurality of transistor chips 230, 230a, 230b, e.g., a plurality of input impedance transformation circuits 350, 350a, 350b, and, e.g., a plurality of output impedance transformation circuits 250, 250a, 250b. The transistor chips 230, 230a, 230b, the input impedance transformation circuits 350, 350a, 350b and the output impedance transformation circuits 250, 250a, 250b may be mounted on the common carrier 710, as it is also depicted in FIG. 15. The electronic RF power device 1600 further comprises the device input terminal 110 and the device output terminal 120. The device RF input and RF output terminals 110, 120 may, e.g., be formed by single leads each extending along one longitudinal side of the package.

The package may further comprise one or more device power supply terminals 1610. The device power supply terminals 1610 may be configured to be electrically connected to an external supply voltage $V_{DD}$.

The first contact clip 1360 is bonded to the input impedance transformation circuits 350, 350a, 350b. By way of example, each input impedance transformation circuit 350, 350a, 350b may comprise or be a capacitor and the first contact clip 1360 may be bonded and electrically connected to top side electrodes (not shown) on the capacitors. Further, the first contact clip 1360 is electrically connected to the device input terminal 110. The first and second contact clips 1360, 1380 may have an elongate shape oriented substantially perpendicular to a (width) direction given by an imaginary connection between the device input terminal 110 and the device output terminal 120.

FIG. 17 illustrates a sectional view along line B-B of FIG. 16. Bottom electrodes (not shown) of the input impedance transformation circuits (e.g. capacitors) 350, 350a, 350b may be bonded to the common carrier 710. The first contact clip 1360 may have two stepped end sections which are elevated relative to the central main section of the first contact clip 1360 overlying the input impedance transformation circuits 350, 350a, 350b. By way of example, the first contact clip 1360 may have a thickness T1 of equal to or greater than 0.2 mm, 0.25 mm, 0.3 mm, 0.4 mm. The first contact clip 1360 may have a length L1 of equal to or greater than 50%, 60%, 70%, 80%, 90% of the overall length L of the longitudinal package dimension.

Further, the first contact clip 1360 may comprise a mesh structure formed by a pattern of openings 1620. By way of example, the number of openings provided in the first contact clip 1360 may be equal to or greater than 4, 8, 12, 16, 20, 24, etc. The openings 1620 may provide for a mold lock mechanism to enhance the integrity of the package.

The second contact clip 1380 may be designed identical as the first contact clip 1360, and reference is made to the above description, in particular as relates to material, dimensions, mesh structure etc., in order to avoid reiteration. Further, the above description relating to the input impedance transformation circuits 350, 350a, 350b, their constitution and electrical interconnections to the first contact clip 1360 may identically apply to the output impedance transformation circuits 250, 250a, 250b and their constitution and electrical interconnections to the second contact clip 1380, and reference is made to the above description in order to avoid reiteration. As a difference between the input and output side of the electronic RF power device 1600, the second contact clip 1380 may be electrically connected to the device power supply terminal 1610 rather than to the device output terminal 120.

It is to be noted that the top view of FIG. 16 may analogously apply to the electronic RF power devices 1300, 1400, 1500, in which some of the output side components (FIG. 13) or input side components (FIG. 14) may be omitted.

FIG. 18 illustrates a sectional view along line A-A of FIG. 16. The carrier 710 may, e.g., be exposed at the bottom side of the package of the electronic RF power device 1600. Here and in all other embodiments, the carrier 710 may have a thickness T2 of equal to or greater than 0.6 mm, 0.8 mm, 1.0 mm, 1.2 mm, or 1.4 mm. Overall length L of the package may be equal to or greater than or less than 8 mm, 10 mm, 12 mm, or 14 mm. Width W of the package may be equal to or greater than or less than 5 mm, 7 mm, or 9 mm. The carrier 710 may have an anti-flash profile provided at the lower edge of the carrier 710. The anti-flash profile 710a may have the shape of a cutout running around the bottom side periphery of the carrier 710. The anti-flash profile 710a will limit the mold material (encapsulation material) from sipping under the carrier (heat sink) 710. It will help to maintain the lower carrier 710 surface area free from mold material and thus solderable.

FIG. 18 further illustrates a possible internal wiring or interconnect of the package components. By way of example, the upper electrode (not shown) of the input impedance transformation circuit 350 may be connected by bond wire 1860 to an electrode (e.g. control electrode or gate) of the transistor chip 230. A load electrode (e.g. drain) of the transistor chip 230 may be connected by bond wire 1840 to the device output terminal 120. A load electrode (e.g. source electrode) of the transistor chip 230 may be connected by bond wire 1820 to an electrode (e.g. top electrode) of the output impedance transformation circuit 250. It is to be noted that the bond wires 1840, 1860 may be replaced by output control clip(s) 240 and first input contact clip 360, respectively, as already described above in relation to further embodiments. The bond wire 1820 may be a tuning wire similar to bond wire 260.

Figure 19:
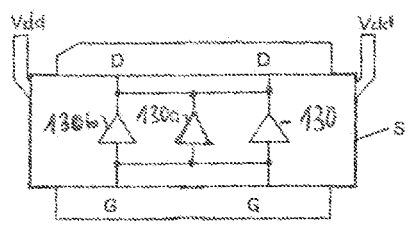
FIG. 19 illustrates a schematic top view diagram of the exemplary RF power electronic device of FIGS. 16 to 18.
Figure 20:
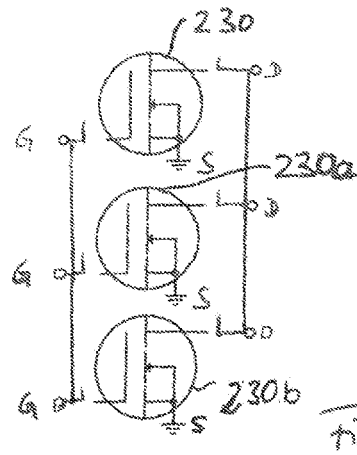
FIG. 20 illustrates a schematic circuit diagram of the electronic RF power device of FIGS. 16 to 18.

FIGS. 19 and 20 illustrate an exemplary schematic top view diagram (pin-out diagram) and an exemplary schematic circuit diagram of, e.g., the electronic RF power device 1600. The amplification stages 130, 130a, 130b may be connected in parallel and may be implemented, e.g., by transistor chips 230, 230a, 230b, e.g. LDMOS transistor chips.

FIG. 21 illustrates a top view of the electronic RF power device 1600 equipped with an exemplary internal wiring. Bond wires 1860 interconnecting the input impedance transformation circuit 350, 350a, 350b with the transistor chip 230, 230a, 230b, bond wires 1840 interconnecting the transistor chip 230, 230a, 230b with the device output terminal 120, and bond wires 1820 interconnecting the transistor chip 230, 230a, 230b with the output impedance transformation circuit 250, 250a, 250b have already been described by way of example. Further, additional bond wires 2110 may, e.g., be provided to create an electrical interconnect between the device input terminal 110 and the first contact clip 1360 and/or between the second contact clip 1380 and the device output terminal 120.

Referring to FIG. 22, at S1 a transistor chip is mounted on a carrier. By way of example, the carrier may be a leadframe which has been prepared, e.g. pre-plated, in advance of S1.

At S2 at least one of an input impedance transformation circuit and an output impedance transformation circuit is mounted on the carrier. S2 may comprise a capacitor die attach to the carrier. S2 may be performed before, simultaneously or after S1.

At S3 at least one of a first contact clip is bonded to the input impedance transformation circuit and to a device input terminal and/or a second contact clip is bonded to an output impedance transformation circuit and to a device power supply terminal, wherein the at least one of the first contact clip and the second contact clip comprises a mesh structure formed by a pattern of openings.

After S3 additional steps such as, e.g., encapsulating/molding and, e.g., post mold curing, deflashing, trim/form/singulation of individual packages and placing the individual packages on a tray may be performed.

Although specific embodiments have been illustrated and described herein, it will be appreciated by those of ordinary skill in the art that a variety of alternate and/or equivalent implementations may be substituted for the specific embodiments shown and described without departing from the scope of the present invention. In view of disclosure, features explained in conjunction with the embodiments of FIGS. 1-12 may be included in embodiments exemplified in FIGS. 13-22 and vice versa. This application is intended to cover any adaptations or variations of the specific embodiments discussed herein. Therefore, it is intended that this invention be limited only by the claims and the equivalents thereof.

What is claimed is:

1. An electronic RF power device, comprising:
   a transistor chip;
   a device input terminal;
   a device output terminal;
   an output impedance transformation circuit;
   an output contact clip bonded to the transistor chip and to the output device terminal; and
   at least one bond wire bonded to the output impedance transformation circuit and to the transistor chip.

2. The electronic RF power device of claim 1, wherein the transistor chip is selected from the group consisting of a LDMOS chip, a SiC chip, a GaN chip, a GaAs chip, and a Si bipolar chip.

3. The electronic RF power device of claim 1, wherein the output impedance transformation circuit comprises a capacitor die.

4. The electronic RF power device of claim 1, further comprising:
   an input impedance transformation circuit; and
   a first input contact clip bonded to the device input terminal and to the input impedance transformation circuit.

5. The electronic RF power device of claim 4, further comprising:
   a second input contact clip bonded to the input impedance transformation circuit and to the transistor chip.

6. The electronic RF power device of claim 4, wherein the input impedance transformation circuit comprises a capacitor die.

7. The electronic RF power device of claim 1, further comprising:
   a carrier on which the transistor chip and the output impedance transformation circuit are mounted, wherein the carrier comprises a trench located between the transistor chip and the output impedance transformation circuit.

8. An electronic RF power device, comprising:
   a transistor chip;
   a device input terminal;
   a device output terminal;
   an input impedance transformation circuit; and
   a first input contact clip bonded to the device input terminal and to the input impedance transformation circuit.

9. The electronic RF power device of claim 8, further comprising:
   an output impedance transformation circuit; and at least one bond wire bonded to the output impedance transformation circuit and to the transistor chip.

10. A method of manufacturing an electronic RF power device, the method comprising:
- mounting a transistor chip on a carrier;
- mounting an output impedance transformation circuit on the carrier;
- bonding an output contact clip to the transistor chip and to an output device terminal; and
- bonding at least one bond wire to the output impedance transformation circuit and to the transistor chip.

11. The method of claim 10, further comprising:
- bonding a first input contact clip to a device input terminal and to an input impedance transformation circuit.

12. The method of claim 11, further comprising:
- bonding a second input contact clip to the input impedance transformation circuit and to the transistor chip.

13. An electronic RF power device, comprising:
- a transistor chip;
- a device input terminal;
- a device output terminal;
- a device power supply terminal;
- at least one of an output impedance transformation circuit and an input impedance transformation circuit; and
- at least one of a first contact clip bonded to the input impedance transformation circuit and to the device input terminal, and a second contact clip bonded to the output impedance transformation circuit and to the device power supply terminal,
- wherein the at least one of the first contact clip and the second contact clip comprises a mesh structure formed by a pattern of openings.

14. The electronic RF power device of claim 13, wherein the transistor chip is selected from the group consisting of a LDMOS chip, a SiC chip, a GaN chip, a GaAs chip, and a Si bipolar chip.

15. The electronic RF power device of claim 13, wherein the at least one of an output impedance transformation circuit and an input impedance transformation circuit comprises a plurality of capacitor dies, and wherein the at least one of a first contact clip and a second contact clip is bonded to and electrically interconnects the plurality of capacitor dies.

16. The electronic RF power device of claim 13, wherein the contact clip has an elongated shape oriented substantially perpendicular to a direction given by an imaginary connection line between the device input terminal and the device output terminal.

17. The electronic RF power device of claim 13, further comprising:
- at least one bond wire bonding the contact clip to one of the device input terminal and the device output terminal.

18. A method of manufacturing an electronic RF power device, the method comprising:
- mounting a transistor chip on a carrier;
- mounting at least one of an input impedance transformation circuit and an output impedance transformation circuit on the carrier; and
- bonding at least one of a first contact clip to the input impedance transformation circuit and to a device input terminal, and a second contact clip to an output impedance transformation circuit and to a device power supply terminal,
- wherein the at least one of the first contact clip and the second contact clip comprises a mesh structure formed by a pattern of openings.

19. The method of claim 18, further comprising:
- bonding at least one bond wire to the first contact clip and the device input terminal or to the second contact clip and the device output terminal.

20. The method of claim 18, further comprising:
- covering the transistor chip, the at least one of the input impedance transformation circuit and the output impedance transformation circuit and the at least one of the first contact clip and the second contact clip with an encapsulating material to form an encapsulant, whereby the mesh structure acts as an encapsulant lock.

* * * * *